(12) United States Patent
Hayashishita

(10) Patent No.: US 11,747,388 B2
(45) Date of Patent: Sep. 5, 2023

(54) METHOD FOR MANUFACTURING ELECTRONIC APPARATUS, ADHESIVE FILM FOR MANUFACTURING ELECTRONIC APPARATUS, AND ELECTRONIC COMPONENT TESTING APPARATUS

(71) Applicant: MITSUI CHEMICALS TOHCELLO, INC., Tokyo (JP)

(72) Inventor: Eiji Hayashishita, Nagoya (JP)

(73) Assignee: MITSUI CHEMICALS TOHCELLO, INC., Tokyo (JP)

( * ) Notice: Subject to any disclaimer, the term of this patent is extended or adjusted under 35 U.S.C. 154(b) by 91 days.

(21) Appl. No.: 17/178,905

(22) Filed: Feb. 18, 2021

(65) Prior Publication Data

US 2021/0172993 A1 Jun. 10, 2021

Related U.S. Application Data

(62) Division of application No. 16/344,900, filed as application No. PCT/JP2017/038366 on Oct. 24, 2017, now Pat. No. 11,047,900.

(30) Foreign Application Priority Data

Oct. 27, 2016 (JP) ................................ 2016-210626

(51) Int. Cl.
*G01R 31/26* (2020.01)
*H01L 21/66* (2006.01)
(Continued)

(52) U.S. Cl.
CPC ....... *G01R 31/2601* (2013.01); *G01R 1/0408* (2013.01); *G01R 1/07342* (2013.01); *G01R 31/26* (2013.01); *H01L 22/14* (2013.01)

(58) Field of Classification Search
CPC .............. G01R 31/2601; G01R 1/0408; G01R 1/07342; G01R 31/26; H01L 22/14;
(Continued)

(56) References Cited

U.S. PATENT DOCUMENTS 6,445,202 B1 9/2002 Cowan et al.
6,466,046 B1 10/2002 Maruyama et al.
(Continued)

FOREIGN PATENT DOCUMENTS

CN 1258096 A 6/2000
CN 102472790 A1 5/2012
(Continued)

OTHER PUBLICATIONS

Office Action dated Aug. 20, 2020, by the Korean Intellectual Property Office in corresponding Korean Patent Application No. 10-2019-7011795. (15 pages).
(Continued)

*Primary Examiner* — Lee E Rodak
*Assistant Examiner* — Trung Q Nguyen
(74) *Attorney, Agent, or Firm* — BUCHANAN INGERSOLL & ROONEY PC

(57) ABSTRACT

A method for manufacturing electronic apparatus includes: a step (A) of preparing a structure provided with an adhesive film and one or two or more electronic components affixed to an adhesive surface of the adhesive film; a step (B) of disposing the structure in the electronic component testing apparatus such that the electronic component is positioned over an electronic component installation region of a sample stand of the electronic component testing apparatus in a defined manner; a step (C) of evaluating the properties of the electronic component in a state of being affixed to the adhesive film with the probe terminal being in contact with a terminal of the electronic component; and a step (D) of
(Continued)

picking up the electronic component from the adhesive film after the step (C). A defined sample stand is also provided.

3 Claims, 8 Drawing Sheets

(51) Int. Cl.
  *G01R 1/04* (2006.01)
  *G01R 1/073* (2006.01)
(58) Field of Classification Search
  CPC . B32B 2250/24; H10K 77/111; C23C 16/401; C08J 7/043
  USPC ........ 324/754.01–754.3, 500, 754.07, 754.1, 324/754.11, 754.21, 755.01, 755, 11, 324/756.3, 758.01, 690, 696; 438/15–18; 257/707, 722, 737, 738, 778; 29/417, 29/592.1, 593, 831, 842, 846, 854
  See application file for complete search history.

(56) References Cited

U.S. PATENT DOCUMENTS

| | | | |
|---|---|---|---|
| 6,512,391 | B2 | 1/2003 | Cowan et al. |
| 6,541,989 | B1 | 4/2003 | Norris et al. |
| 6,603,325 | B2 | 8/2003 | Maruyama et al. |
| 6,642,732 | B2 | 11/2003 | Cowan et al. |
| 6,781,395 | B2 | 8/2004 | Maruyama et al. |
| 7,138,813 | B2 | 11/2006 | Cowan et al. |
| 7,292,057 | B2 | 11/2007 | Cowan et al. |
| 7,616,017 | B2 | 11/2009 | Cowan et al. |
| 10,141,204 | B2 | 11/2018 | Kotera et al. |
| 2005/0003635 | A1 | 1/2005 | Takekoshi |
| 2005/0019980 | A1 | 1/2005 | Kurosawa et al. |
| 2005/0176171 | A1* | 8/2005 | Miyaki ............... H01L 25/0657 438/106 |
| 2005/0224978 | A1 | 10/2005 | Kawate et al. |
| 2012/0295416 | A1 | 11/2012 | Kimura et al. |
| 2013/0122615 | A1 | 5/2013 | Kobashi et al. |

FOREIGN PATENT DOCUMENTS

| | | | | |
|---|---|---|---|---|
| CN | 104231962 | A | 12/2014 | |
| CN | 105907317 | A | 8/2016 | |
| JP | S56097884 | A | 8/1981 | |
| JP | S63013339 | A | 1/1988 | |
| JP | H02235355 | A | 9/1990 | |
| JP | H10163281 | A | 6/1998 | |
| JP | 2001068515 | A | 3/2001 | |
| JP | 2015169589 | A * | 2/2015 | ............ G01R 31/28 |
| JP | 2015109436 | A | 6/2015 | |
| JP | 2015169589 | A | 9/2015 | |
| TW | 200402457 | A | 2/2004 | |
| TW | 200641086 | A | 12/2006 | |
| TW | 201634630 | A | 10/2016 | |
| WO | 2011004825 | A1 | 1/2011 | |

OTHER PUBLICATIONS

Extended European Search Report dated May 15, 2020, by the European Patent Office in corresponding European Patent Application No. 17866122.9. (8 pages).

International Search Report (with English translation) and Written Opinion dated Dec. 1, 2017, in corresponding International Patent Application No. PCT PCT/JP2017/038366. (11 pages).

Office Action dated Mar. 11, 2021, by the Taiwanese Patent Office in corresponding Taiwanese Patent Application No. 106136860. (10 pages).

Office Action dated Dec. 23, 2020, by the State Intellectual Property Office of the People's Republic of China in corresponding Chinese Patent Application No. 201780066329.X. (9 pages).

Notice of Allowance dated Mar. 15, 2021, by the U.S Patent and Trademark Office in U.S. Appl. No. 16/344,900. (8 pages).

\* cited by examiner (a)

(b)

METHOD FOR MANUFACTURING ELECTRONIC APPARATUS, ADHESIVE FILM FOR MANUFACTURING ELECTRONIC APPARATUS, AND ELECTRONIC COMPONENT TESTING APPARATUS

CROSS-REFERENCE TO RELATED APPLICATIONS

This application is a division of U.S. patent application Ser. No. 16/344,900, filed on Apr. 25, 2019, now U.S. Pat. No. 11,047,900, which in turn is a U.S. national stage application of PCT/JP2017/038366, filed on Oct. 24, 2017, which claims priority to Japanese Patent Application No. 2016-210626, filed on Oct. 27, 2016, the entire contents of all of which are hereby incorporated by reference.

TECHNICAL FIELD

The present invention relates to a method for manufacturing electronic apparatus, an adhesive film for manufacturing an electronic apparatus, and an electronic component testing apparatus.

BACKGROUND ART

There is a case where the properties of an electronic component are evaluated in an electronic apparatus manufacturing step.

In a step of evaluating the properties of an electronic component, for example, the properties of an electronic component are evaluated at a high temperature or a low temperature. Accordingly, deterioration of an electronic component that has a cause of failure can be accelerated so that an initial failure of the electronic component occurs early and thus the defective product can be removed. Accordingly, it is possible to efficiently obtain an electronic component excellent in reliability.

Examples of a technique related to such an accelerated property evaluation test for an electronic component include a technique described in Patent Document 1 (Japanese Published Patent Application A-H10-163281).

Patent Document 1 discloses a semiconductor element manufacturing method of manufacturing a semiconductor element in which dicing is performed on a semiconductor wafer on which a plurality of semiconductor elements are formed, a contact terminal connected to a tester is pressed against an electrode formed on the semiconductor element to establish electrical connection in a state where a positional relationship between the semiconductor elements subjected to the dicing is maintained, and inspection is performed through an operation property test with respect to the semiconductor element by using the tester in a state where the connection is established.

RELATED DOCUMENT

Patent Document

[Patent Document 1] Japanese Published Patent Application A-H10-163281

SUMMARY OF THE INVENTION

Technical Problem

The present inventors have found out that there is a case where a wrinkle 53A is generated due to heating or cooling performed on an adhesive film 50A fixing an electronic component 70A and the wrinkle 53A comes into contact with a probe terminal 95A at the time of property evaluation of the electronic component 70A (refer to FIG. 10). In this case, the properties of the electronic component 70A cannot be accurately evaluated since the adhesive film 50A interferes with the probe terminal 95A.

That is, the present inventors have found out that there is a room for improving a step of evaluating the properties of an electronic component in the viewpoint of accurately and stably performing the property evaluation of the electronic component.

The present invention has been made in consideration of the above-described circumstances and provides a method for manufacturing electronic apparatus with which it is possible to accurately and stably perform property evaluation of an electronic component.

Solution to Problem

The present inventors have conducted intensive studies to achieve the above object. As a result, the present inventors have found that it is possible to suppress contact between an adhesive film and a probe terminal and to accurately and stably perform the property evaluation of the electronic component by vacuum-sucking a region of the adhesive film to which no electronic component is affixed when evaluating the properties of the electronic component and have completed the present invention.

The present invention provides a method for manufacturing electronic apparatus, an adhesive film for manufacturing an electronic apparatus, and an electronic component testing apparatus as follows.

[1]

A method for manufacturing electronic apparatus including:

a step (A) of preparing a structure provided with an adhesive film and one or two or more electronic components affixed to an adhesive surface of the adhesive film;

a step (B) of disposing the structure in an electronic component testing apparatus such that the electronic component is positioned over an electronic component installation region of a sample stand of the electronic component testing apparatus with the adhesive film interposed between the electronic component and the electronic component installation region, the electronic component testing apparatus being provided with the sample stand including the electronic component installation region and a probe card that is provided at a position facing the sample stand and includes a probe terminal;

a step (C) of evaluating properties of the electronic component in a state of being affixed to the adhesive film with the probe terminal being in contact with a terminal of the electronic component; and a step (D) of picking up the electronic component from the adhesive film after the step (C), in which the sample stand is provided with a first vacuum suction unit in a region on an outer peripheral side which is different from the electronic component installation region, the first vacuum suction unit vacuum-sucking the adhesive film, and at least in the step (C), the first vacuum suction unit vacuum-sucks a region of the adhesive film to which no electronic component is affixed.

[2]
The method for manufacturing electronic apparatus described in [1],
in which the sample stand is provided with a second vacuum suction unit in at least the electronic component installation region, the second vacuum suction unit holding the structure by means of vacuum suction.

[3]
The method for manufacturing electronic apparatus described in [1] or [2],
in which the first vacuum suction unit is a vacuum adsorption groove which is continuously closed over an outer periphery of the sample stand.

[4]
The method for manufacturing electronic apparatus described in any one of [1] to [3],
in which an outer peripheral portion of the sample stand is provided with a vacuum seal portion.

[5]
The method for manufacturing electronic apparatus described in any one of [1] to [4],
in which, in the step (C), property evaluation of the electronic component is performed at a temperature of equal to or lower than 0° C. or equal to or higher than 50° C. and equal to or lower than 200° C.

[6]
The method for manufacturing electronic apparatus described in any one of [1] to [5],
in which, in the step (D), the electronic component is picked up from the adhesive film in a state where an interval between adjacent electronic components is enlarged by expanding a region of the adhesive film, to which the electronic components are affixed, in an in-plane direction of the film.

[7]
The method for manufacturing electronic apparatus described in any one of [1] to [6],
in which the adhesive film includes at least a flexible resin layer and an adhesive resin layer.

[8]
The method for manufacturing electronic apparatus described in [7],
in which a flexible resin constituting the flexible resin layer contains one or two or more selected from the group consisting of polyester elastomer, polyamide elastomer, polyimide elastomer, and polybutylene terephthalate.

[9]
An adhesive film for manufacturing an electronic apparatus which is used in the method for manufacturing electronic apparatus described in any one of claims [1] to [8], the adhesive film including:
at least a flexible resin layer and an adhesive resin layer.

[10]
The adhesive film for manufacturing an electronic apparatus described in [9],
in which a melting point of the flexible resin layer is equal to or higher than 100° C. and equal to or lower than 250° C.

[11]
The adhesive film for manufacturing an electronic apparatus described in [9] or [10],
in which a flexible resin constituting the flexible resin layer contains one or two or more selected from the group consisting of polyester elastomer, polyamide elastomer, polyimide elastomer, and polybutylene terephthalate.

[12]
The adhesive film for manufacturing an electronic apparatus described in any one of [9] to [11],
in which an adhesive constituting the adhesive resin layer contains one or two or more selected from the group consisting of a (meth)acrylic adhesive, a silicone adhesive, a urethane adhesive, an olefin adhesive, and a styrene adhesive.

[13]
An electronic component testing apparatus which is used to evaluate properties of an electronic component, the electronic component testing apparatus including:
a sample stand including an electronic component installation region; and
a probe card that is provided at a position facing the sample stand and includes a probe terminal,
in which the sample stand is provided with a first vacuum suction unit in a region on an outer peripheral side which is different from the electronic component installation region, the first vacuum suction unit vacuum-sucking a region of the adhesive film to which no electronic component is affixed.

[14]
The electronic component testing apparatus described in [13],
in which the sample stand is provided with a second vacuum suction unit in at least the electronic component installation region, the second vacuum suction unit holding the electronic component and the adhesive film by means of vacuum suction.

[15]
The electronic component testing apparatus described in [13] or [14],
in which the first vacuum suction unit is a vacuum adsorption groove which is continuously closed over an outer periphery of the sample stand.

[16]
The electronic component testing apparatus described in any one of [13] to [15],
an outer peripheral portion of the sample stand is provided with a vacuum seal portion.

Advantageous Effects of Invention

According to the present invention, it is possible to provide a method for manufacturing electronic apparatus with which it is possible to accurately and stably perform property evaluation of an electronic component.

BRIEF DESCRIPTION OF THE DRAWINGS

The above described object and other objects, features, and advantages will become more apparent from the following description of the preferred embodiments and accompanying drawings.

FIG. 2(a) illustrates a state where the structure is disposed in the electronic component testing apparatus and FIG. 2(b) illustrates a state where the properties of electronic components are evaluated.

DESCRIPTION OF EMBODIMENTS

Figure 1:
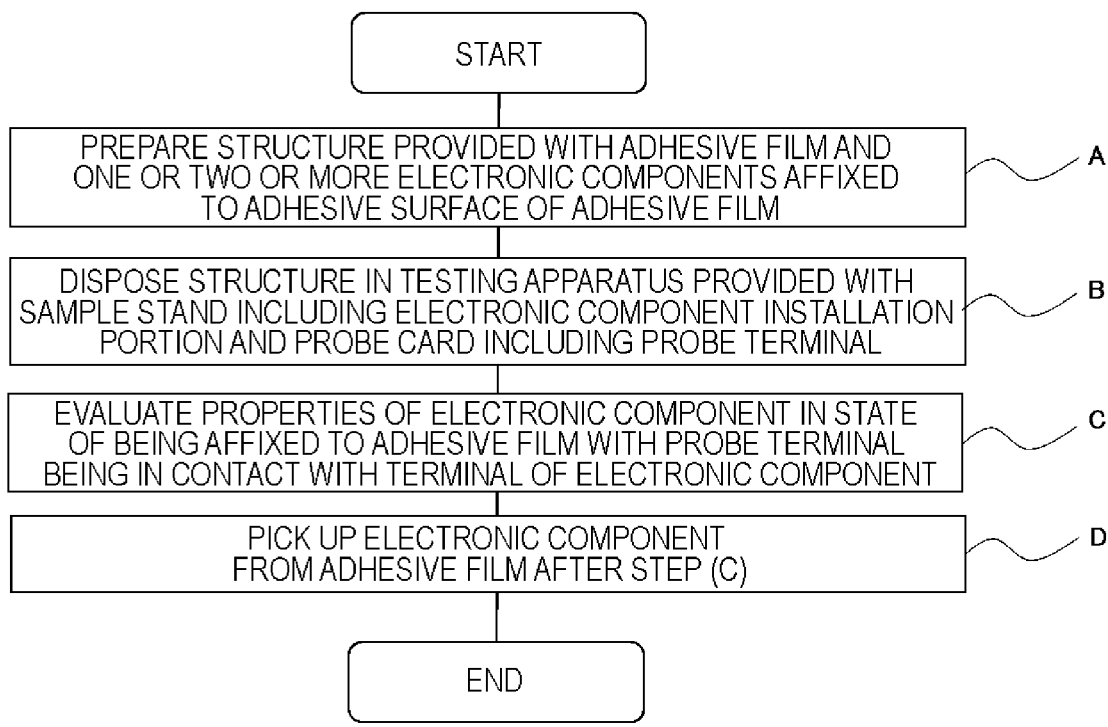
FIG. 1 is a flowchart illustrating an example of a method for manufacturing electronic apparatus according to an embodiment of the present invention.

Hereinafter, an embodiment of the present invention will be described by using the drawings. Note that, in all of the drawings, the same constituent elements will be given the same reference numerals and description thereof will not be repeated appropriately. In addition, the drawings are schematic views and do not match the actual dimension ratios. In addition, unless otherwise noted, a value range of "A to B" means being equal to or greater than A and equal to or lower than B. In addition, in the present embodiment, "(meth) acryl" means one or both of acryl and methacryl.

1. Method for Manufacturing Electronic Apparatus and Electronic Component Testing Apparatus First, a method for manufacturing electronic apparatus and an electronic component testing apparatus according to the present embodiment will be described.

Figure 2:
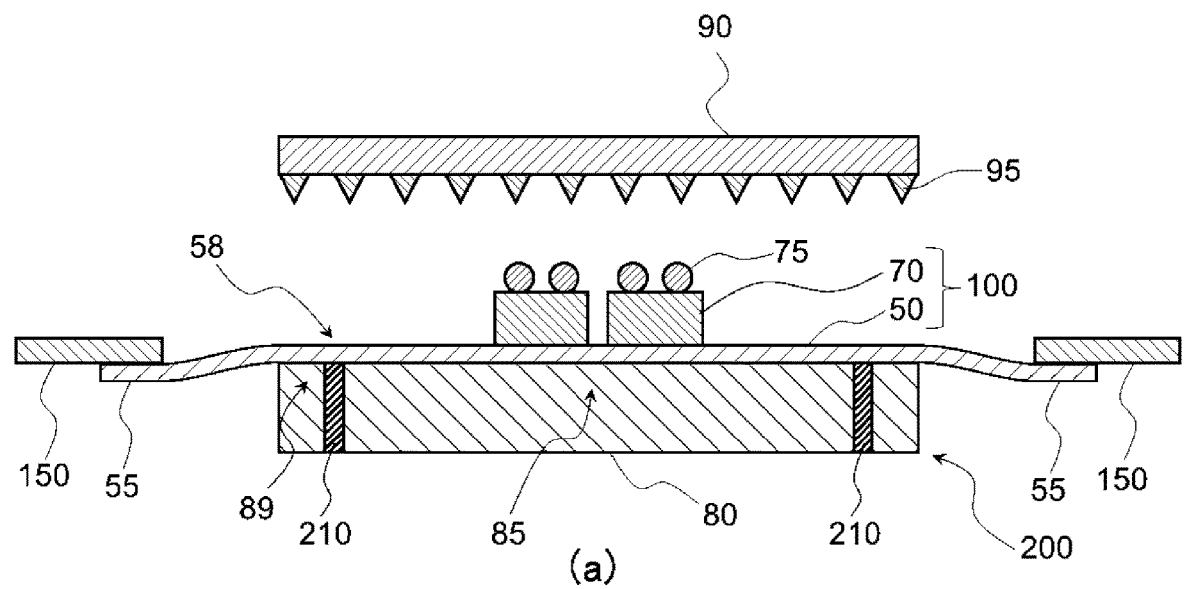
FIG. 2 is a sectional view schematically illustrating an example of the structure of an electronic component testing apparatus and a structure according to the embodiment of the present invention, where
Figure 2:
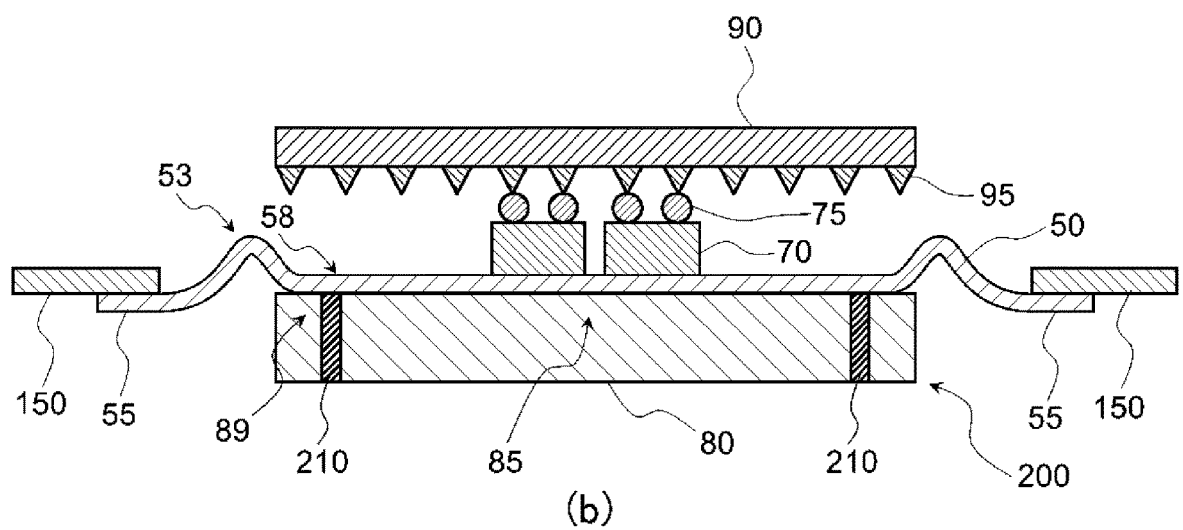
Figure 3:
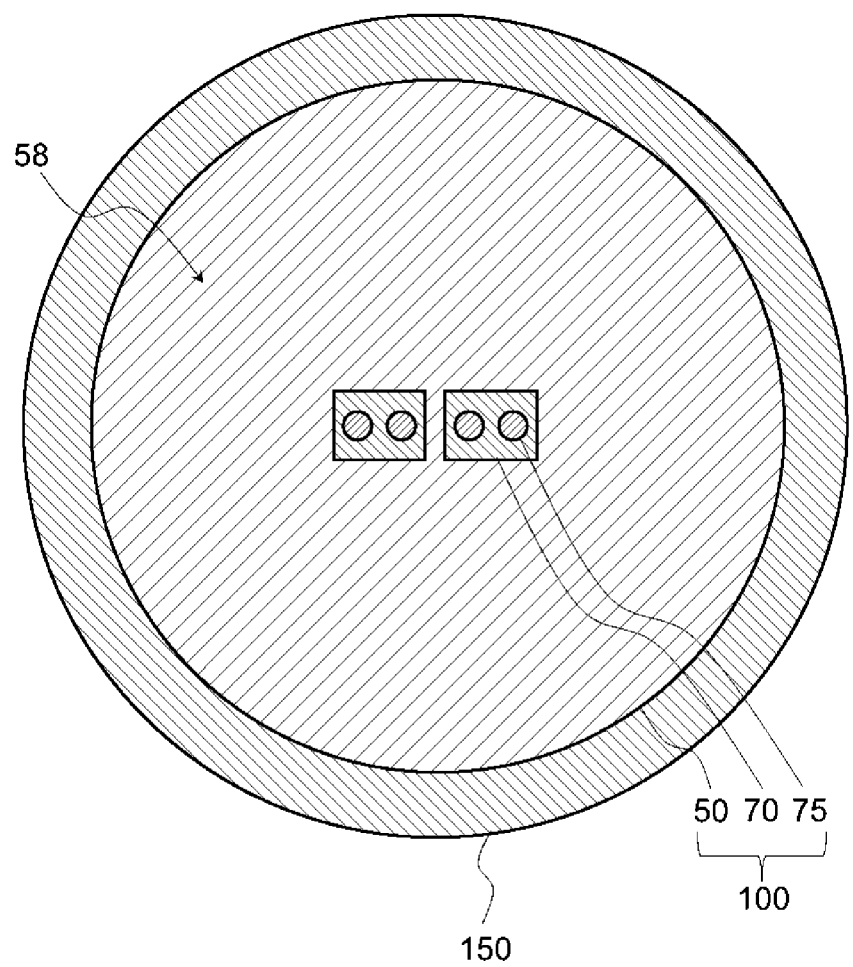
FIG. 3 is a plan view schematically illustrating an example of the structure of the structure according to the embodiment of the present invention.
Figure 4:
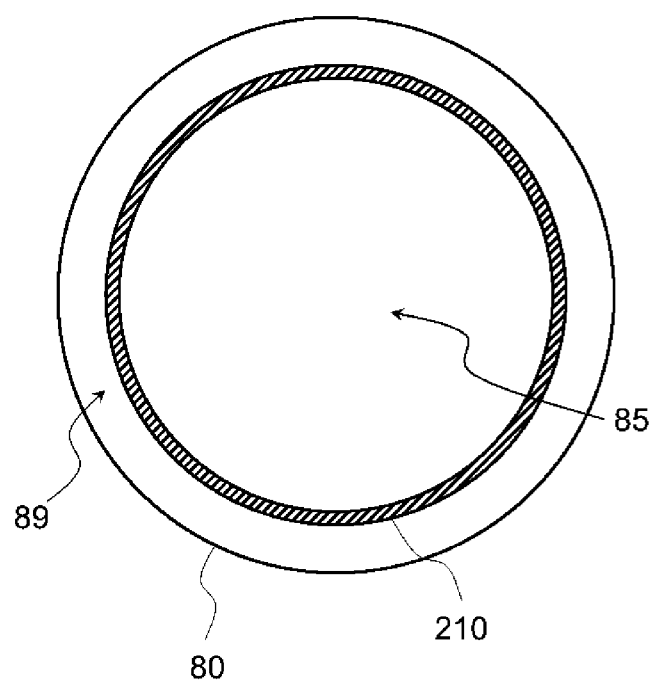
FIG. 4 is a plan view schematically illustrating an example of the structures of the first vacuum suction unit according to the embodiment of the present invention.

FIG. 1 is a flowchart illustrating an example of a method for manufacturing electronic apparatus according to the embodiment of the present invention. FIG. 2 is a sectional view schematically illustrating an example of the structure of an electronic component testing apparatus 200 and a structure 100 according to the embodiment of the present invention, where FIG. 2(a) illustrates a state where the structure 100 is disposed in the electronic component testing apparatus 200 and FIG. 2(b) illustrates a state where the properties of electronic components 70 are evaluated. FIG. 3 is a plan view schematically illustrating an example of the structure of the structure 100 according to the embodiment of the present invention. FIG. 4 is a plan view schematically illustrating an example of the structure of a first vacuum suction unit 210 according to the embodiment of the present invention.

The method for manufacturing electronic apparatus according to the present embodiment includes at least the following four steps:

(A) a step of preparing the structure 100 provided with an adhesive film 50 and one or two or more electronic components 70 affixed to an adhesive surface of the adhesive film 50;

(B) a step of disposing the structure 100 in the electronic component testing apparatus 200 such that the electronic component 70 is positioned over an electronic component installation region 85 of a sample stand 80 of the electronic component testing apparatus 200 with the adhesive film 50 interposed between the electronic component 70 and the electronic component installation region 85, the electronic component testing apparatus 200 being provided with the sample stand 80 including the electronic component installation region 85 and a probe card 90 that is provided at a position facing the sample stand 80 and includes a probe terminal 95;

(C) a step of evaluating the properties of the electronic component 70 in a state of being affixed to the adhesive film 50 with the probe terminal 95 being in contact with a terminal 75 of the electronic component 70; and (D) a step of picking up the electronic component 70 from the adhesive film 50 after the step (C).

In addition, the sample stand 80 is provided with the first vacuum suction unit 210 in a region 89 on an outer peripheral side which is different from the electronic component installation region 85, the first vacuum suction unit 210 vacuum-sucking the adhesive film 50 and at least in the step (C), the first vacuum suction unit 210 vacuum-sucks a region 58 of the adhesive film 50 to which no electronic component 70 is affixed.

Figure 10:
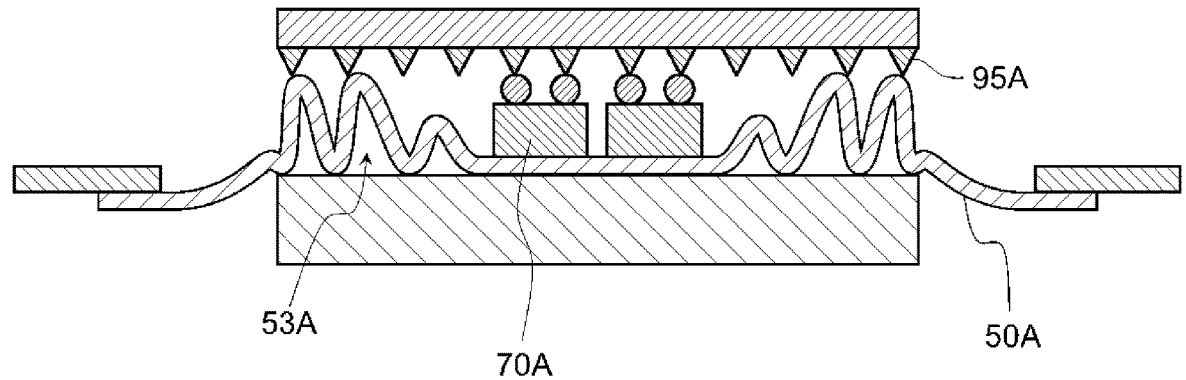
FIG. 10 is a sectional view schematically illustrating contact between the adhesive film and a probe terminal at the time of property evaluation of an electronic component.

The present inventors have found out that there is a case where a wrinkle 53A is generated due to heating or cooling performed on an adhesive film 50A fixing an electronic component 70A and the wrinkle 53A comes into contact with a probe terminal 95A at the time of property evaluation of the electronic component 70A (refer to FIG. 10). In this case, the properties of the electronic component 70A cannot be accurately evaluated since the adhesive film 50A interferes with the probe terminal 95A.

That is, the present inventors have found out that there is a room for improving a step of evaluating the properties of an electronic component in the viewpoint of accurately and stably performing the property evaluation of the electronic component.

The present inventors have conducted intensive studies to achieve the above object. As a result, the present inventors have found that it is possible to suppress contact between the adhesive film 50 and the probe terminals 95 and to accurately and stably perform the property evaluation of the electronic components 70 by vacuum-sucking the region 58 of the adhesive film 50 to which no electronic component 70 is affixed when evaluating the properties of the electronic components 70.

That is, since the region 58 in which the adhesive film 50 is in contact with the sample stand 80 and to which no electronic component 70 is affixed mainly has a possibility that a wrinkle 53 is generated due to heating or cooling of the adhesive film 50, it is possible to reduce the wrinkle 53 by vacuum-sucking the region 58 at least in the step (C). As a result, it is possible to decrease the size of the wrinkle 53. Therefore, it is possible to suppress contact between the adhesive film 50 and the probe terminal 95 at the time of the property evaluation of the electronic components 70 as illustrated in FIG. 2 (b) and as a result, it is possible to suppress the adhesive film 50 interfering with the probe terminal 95 and to accurately and stably perform the property evaluation of the electronic component 70.

As described above, according to the method for manufacturing electronic apparatus of the present embodiment, it is possible to accurately and stably perform the property evaluation of the electronic component 70 since the above-described steps (A) to (D) are provided.

Hereinafter, each step in the method for manufacturing electronic apparatus according to the present embodiment will be described.

(Step (A))

First, the structure 100 provided with the adhesive film 50 and one or two or more electronic components 70 affixed to the adhesive surface of the adhesive film 50 is prepared.

Such a structure can be manufactured by affixing the electronic component 70 to the adhesive surface (for example, surface of adhesive resin layer 10 which will be described later) of the adhesive film 50 and dicing the electronic components 70 on the adhesive film 50 as necessary.

Hereinafter, a method of manufacturing the structure 100 will be specifically described using a case where the electronic components 70 are a semiconductor substrate and a semiconductor chip as an example.

First, a semiconductor substrate is affixed to the adhesive surface of the adhesive film 50.

Examples of the semiconductor substrate affixed to the adhesive film 50 include a substrate formed of silicon, germanium, gallium-arsenic, gallium-phosphorus, gallium-arsenic-aluminum, and the like.

Further, as the semiconductor substrate, it is preferable to use a semiconductor substrate having a circuit formed on a surface thereof.

When the electronic component 70 is affixed to the adhesive surface of the adhesive film 50, the electronic components 70 may be affixed to the adhesive surface of the adhesive film 50 after the adhesive film 50 is affixed to a frame 150 or the frame 150 and the electronic components 70 may be affixed to the adhesive film 50 at the same time.

The affixing of the adhesive film 50 may be performed by a human hand, but is usually performed by an automatic affixing device to which a roll-shaped surface protective film is attached.

The temperature of the adhesive film 50 and the semiconductor substrate at the time of affixing is not particularly limited and is preferably 25° C. to 80° C.

The pressure between the adhesive film 50 and the semiconductor substrate at the time of affixing is not particularly limited and is preferably 0.3 MPa to 0.5 MPa.

Next, the semiconductor substrate on the adhesive film 50 is diced into semiconductor chips.

The "dicing" herein include, (a) an operation of dividing a semiconductor substrate by providing a cut having the same depth as the semiconductor substrate with respect to the semiconductor substrate to obtain a plurality of divided semiconductor chips (hereinafter also referred to as "full cut dicing"), and (b) an operation of obtaining a plurality of semiconductor chips by performing laser light irradiation or plasma irradiation with respect to the semiconductor substrate to provide an altered region which does not lead to the cutting of the semiconductor substrate (hereinafter also referred to as "stealth dicing").

The dicing can be performed by using a dicing blade (dicing saw), laser light, plasma, or the like.

In a case where the dicing is the full cut dicing, the semiconductor substrate is divided into a plurality of semiconductor chips by being diced.

Meanwhile, in a case where the dicing is the stealth dicing, the semiconductor substrate is not divided into a plurality of semiconductor chips only by the dicing and the semiconductor substrate is divided due to expansion of the adhesive film 50 after the dicing such that a plurality of divided semiconductor chips are obtained. Note that, the expansion of the adhesive film 50 in the case of the stealth dicing may be performed before the step (C) or after the step (C).

Note that, the electronic components 70 in the step (A) include both of the plurality of divided semiconductor chips which are obtained through the full cut dicing and the plurality of semiconductor chips before the division which are obtained through the stealth dicing.

(Step (B))

Next, the structure 100 is disposed in the electronic component testing apparatus 200 such that the electronic component 70 is positioned over the electronic component installation region 85 of the sample stand 80 of the electronic component testing apparatus 200 with the adhesive film 50 interposed between the electronic components 70 and the electronic component installation region 85.

Hereinafter, the electronic component testing apparatus 200 according to the present embodiment will be described.

The electronic component testing apparatus 200 according to the present embodiment is an electronic component testing apparatus used to evaluate the properties of the electronic components 70 and is provided with the sample stand 80 including the electronic component installation region 85, the probe card 90 that is provided at a position facing the sample stand 80 and includes the probe terminals 95. In addition, the sample stand 80 is provided with the first vacuum suction unit 210 in the region 89 on an outer peripheral side which is different from the electronic component installation region 85, the first vacuum suction unit 210 vacuum-sucking the region 58 of the adhesive film 50 to which no electronic component 70 is affixed.

In addition, the first vacuum suction unit 210 vacuum-sucks the region 58 of the adhesive film 50 to which no electronic component 70 is affixed when the properties of the electronic components 70 are evaluated with the probe terminals 95 being in contact with the terminals 75 of the electronic components 70.

The probe card 90 including the probe terminals 95 is not particularly limited and a generally known probe card can be used.

In addition, it is preferable that the electronic component testing apparatus 200 according to the present embodiment is further provided with the frame 150 within which the electronic components 70 as specimens and the adhesive film 50 holding the electronic components 70 are disposed and that fixes the end portion 55 of the adhesive film 50.

Since the frame 150 is further provided, it is possible to stably hold the electronic components 70 on the adhesive film 50 at the time of the property evaluation of the electronic components 70.

The shape of the frame 150 is not particularly limited and examples of the shape thereof include a circular shape, an elliptical shape, and a rectangular shape. Examples of the frame 150 include a ring frame.

In addition, as illustrated in FIG. 4, it is preferable that the first vacuum suction unit 210 is a vacuum adsorption groove which is continuously closed over an outer periphery of the sample stand 80.

In this case, a gas flowing into a region inside the continuously closed vacuum adsorption groove can be suppressed and thus it is possible to more effectively suck the adhesive film 50. As a result, it is possible to further suppress the wrinkle 53 generated due to heating or cooling of the adhesive film 50.

Figure 5:
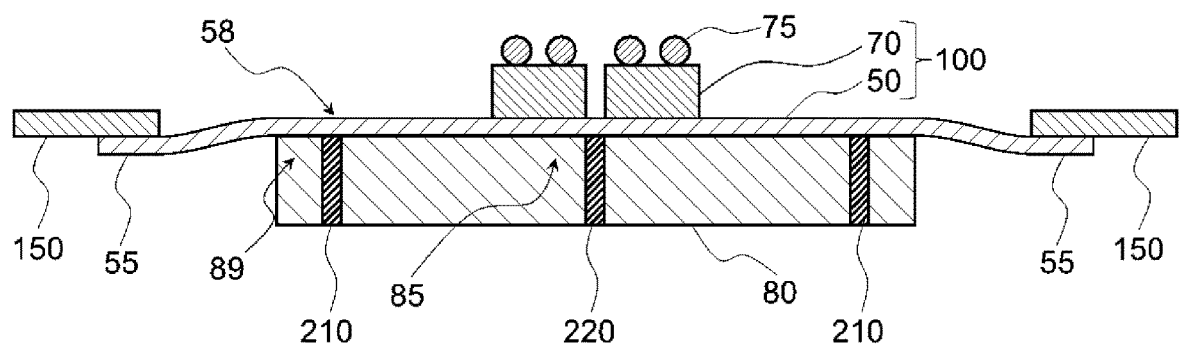
FIG. 5 is a sectional view schematically illustrating an example of the structures of the first vacuum suction unit and a second vacuum suction unit according to the embodiment of the present invention.
Figure 6:
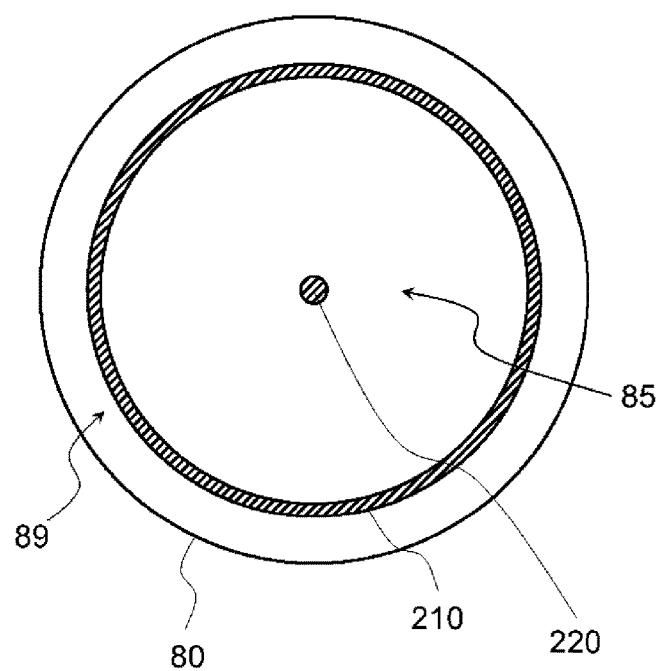
FIG. 6 is a plan view schematically illustrating an example of the structures of the first vacuum suction unit and the second vacuum suction unit according to the embodiment of the present invention.

Here, FIG. 5 is a sectional view schematically illustrating an example of the structures of the first vacuum suction unit 210 and a second vacuum suction unit 220 according to the embodiment of the present invention. FIG. 6 is a sectional view schematically illustrating an example of the structures of the first vacuum suction unit 210 and the second vacuum suction unit 220 according to the embodiment of the present invention.

As illustrated in FIG. 5, in the electronic component testing apparatus 200 according to the present embodiment, it is preferable that the sample stand 80 is further provided with the second vacuum suction unit 220 in at least the electronic component installation region 85.

The second vacuum suction unit 220 holds the electronic components 70 and the adhesive film 50 (structure 100) by means of vacuum suction. Since the electronic component testing apparatus 200 further includes the second vacuum suction unit 220, it is possible to more stably hold the electronic components 70 and the adhesive film 50 (structure 100) on the sample stand 80 when evaluating the properties of the electronic components 70.

The first vacuum suction unit 210 and the second vacuum suction unit 220 are not particularly limited and a known vacuum suction unit can be used. For example, examples of the vacuum suction units include a vacuum suction unit or the like that is configured of a pump (for example, vacuum pump) that performs vacuum suction and an adsorption hole connected to the vacuum pump. Here, vacuum lines of the first vacuum suction unit 210 and the second vacuum suction unit 220 may be independent of each other and may be connected to each other. Here, in FIGS. 2 and 4 to 7, only adsorption holes are illustrated as the first vacuum suction unit 210 and the second vacuum suction unit 220 and vacuum pumps are not shown. The vacuum pumps are connected to the adsorption holes and it is possible to vacuum-suck the electronic components 70 and the adhesive film 50 (structure 100) through the adsorption holes by using the vacuum pumps.

Figure 7:
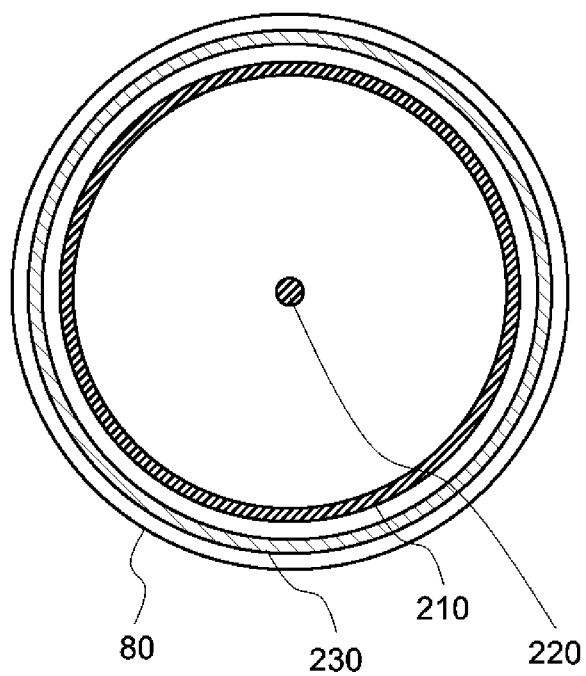
FIG. 7 is a plan view schematically illustrating an example of the structure of a vacuum seal portion according to the embodiment of the present invention.

Here, FIG. 7 is a plan view schematically illustrating an example of the structure of a vacuum seal portion 230 according to the embodiment of the present invention.

In the electronic component testing apparatus 200 according to the present embodiment, it is preferable that an outer peripheral portion of the sample stand 80 is provided with the vacuum seal portion 230. Accordingly, it is possible to make the degree of vacuum of a region positioned inward of the vacuum seal portion 230 more favorable and thus it is possible to more effectively suck the adhesive film 50. As a result, it is possible to further suppress the wrinkle 53 generated due to heating or cooling of the adhesive film 50. The material of the vacuum seal portion 230 is not particularly limited but heat-resistant elastomer such as silicone rubber is preferable.

(Step (C))

Next, the properties of the electronic components 70 in a state of being affixed to the adhesive film 50 are evaluated with the probe terminals 95 being in contact with the terminals 75 of the electronic components 70.

The property evaluation of the electronic components 70 is, for example, an operation confirmation test of the electronic components 70 and can be performed by using the probe card 90 including the probe terminals 95 as illustrated in FIG. 2 (b).

For example, the probe terminals 95, which are connected to a tester through the probe card 90, are brought into contact with the terminals 75 of the electronic components 70. As a result, operation power, an operation test signal, and the like are transferred between the electronic components 70 and the tester and thus it is possible to determine whether the operation properties of the electronic components 70 are favorable or not.

In the step (C), it is preferable that the structure 100 is disposed within the frame 150 as illustrated in FIGS. 2 and 3 and the end portion 55 of the adhesive film 50 is fixed to the frame 150. In this case, it is possible to stably hold the electronic components 70 on the adhesive film 50 at the time of the property evaluation of the electronic components 70.

In addition, as illustrated in FIG. 2(a), the first vacuum suction unit 210 vacuum-sucks the region 58 of the adhesive film 50 to which no electronic component 70 is affixed.

In the step (C), it is preferable to perform the property evaluation of the electronic components 70 at a temperature of equal to or lower than 0° C. or equal to or higher than 50° C. and equal to or lower than 200° C., more preferable to perform the property evaluation of the electronic components 70 at a temperature of equal to or higher than 60° C. and equal to or lower than 180° C., and still more preferable to perform the property evaluation of the electronic components 70 at a temperature of at a temperature of equal to or higher than 80° C. and equal to or lower than 160° C. In this case, it is possible to accelerate deterioration of the electronic component 70 that has a cause of failure can be accelerated so that an initial failure of the electronic component 70 occurs early and thus the defective product can be removed. As a result, it is possible to obtain the electronic components 70 excellent in reliability at a high yield.

For example, it is possible to achieve the above-described temperature by inputting the structure 100 into a thermostatic tank or an oven or heating the structure 100 with a heater provided on the sample stand 80 or the like.

(Step (D))

Next, the electronic components 70 are picked up from the adhesive film 50 after the step (C).

It is possible to peel the electronic components 70 from the adhesive film 50 by picking up the electronic components 70 as described above.

The electronic components 70 can be picked up by a known method.

In the step (D), it is preferable to pick up the electronic components 70 from the adhesive film 50 in a state where an interval between adjacent electronic components 70 is enlarged by expanding a region of the adhesive film 50, to which the electronic components 70 are affixed, in an in-plane direction of the film.

In this case, the electronic components 70 can be easily picked up from the adhesive film 50 since an interval between adjacent electronic components 70 is enlarged. Furthermore, the electronic components 70 can be easily picked up from the adhesive film 50 since an adhesive force between the electronic components 70 and the adhesive film 50 is decreased due to a shearing stress between the electronic components 70 and the adhesive film 50, which is caused by expansion of the adhesive film 50 in the in-plane direction.

In addition, in a case where a film including a heat-resistant resin layer 30, a flexible resin layer 20 and the adhesive resin layer 10 in this order, which will be described later, is used as the adhesive film 50, it is preferable to perform the step (D) by peeling the heat-resistant resin layer 30 from the adhesive film 50 after the step (C). In this case, it is possible to more easily perform the expansion of the adhesive film 50 in the in-plane direction. The peeling of the heat-resistant resin layer 30 is performed by using a hand in some cases, but is generally performed by using a device called an automatic peeling machine.

(Step (E))

The method for manufacturing electronic apparatus according to the present embodiment may further include a step (E) of decreasing an adhesive force of the adhesive film 50 with respect to the electronic components 70 by irradiating the adhesive film 50 with radiation before the step (D) to cross link the adhesive film 50.

Since the step (E) is performed, the electronic components 70 can be easily picked up from the adhesive film 50. In addition, it is possible to suppress contamination of surfaces of the electronic components 70 caused by adhesive components constituting the adhesive film 50.

The irradiation with the radiation is performed from a surface opposite to the adhesive surface of the adhesive film 50.

In a case where ultraviolet radiation is used as the radiation, the dose of ultraviolet radiation with which the adhesive film 50 is irradiated is preferably equal to or greater than 100 mJ/cm$^2$ and more preferably equal to or greater than 350 mJ/cm$^2$.

When the dose of ultraviolet radiation is equal to or greater than the lower limit value, the adhesive force of the adhesive film 50 can be sufficiently decreased. As a result, an adhesive residue generated on a surface of the electronic component 70 can be further suppressed.

In addition, the upper limit of the dose of ultraviolet radiation with which the adhesive film 50 is irradiated is not particularly limited. However, the upper limit is, for example, equal to or smaller than 1500 mJ/cm$^2$ and is preferably equal to or smaller than 1200 mJ/cm$^2$ in the viewpoint of productivity.

The irradiation with ultraviolet radiation can be performed by using, for example, a high-pressure mercury lamp.

The timing of the step (E) is not particularly limited. Although the step (E) may be performed at any of a time between the step (A) and the step (B), a time between the step (B) and the step (C), and a time between the step (C) and the step (D), it is preferable to perform the step (E) at a time between the step (A) and the step (B) in a case where the electronic component installation region 85 is heated in advance. In a case where the temperature is raised after the structure 100 is disposed on the electronic component installation region 85, the step (E) may be performed at a time between the step (B) and the step (C) or a time between the step (C) and the step (D).

(Other Step)

The method for manufacturing electronic apparatus according to the present embodiment may further include a step other than the above-described steps. As the other step, a known step in the method for manufacturing electronic apparatus can be used.

For example, after the step (D) is performed, any step or the like generally performed in a step of manufacturing electronic component such as a step of mounting the electronic components 70 such as obtained semiconductor chips on a circuit board, a wire bonding step, and an encapsulating step may be further performed.

In addition, in a case where a semiconductor substrate having a circuit surface is used as the electronic component 70, for example, a step of forming an electrode on a circuit formation surface of a semiconductor substrate by using a typical method and forming a protective film on a non-circuit surface in a method usually used for may be further included. A manufacturing method including the step of forming the electrode and forming the protective film is also called wafer level package (WLP).

In addition, a step of forming a rewiring layer on the circuit surface of the semiconductor substrate may be further included.

An electronic apparatus obtained by forming the rewiring layer in a wide area that is larger than the area of the semiconductor chip is also called a fan-out package.

2. Adhesive Film

Next, the adhesive film 50 (also called adhesive film for manufacturing electronic apparatus) used in the method for manufacturing electronic apparatus according to the present embodiment will be described.

Figure 8:
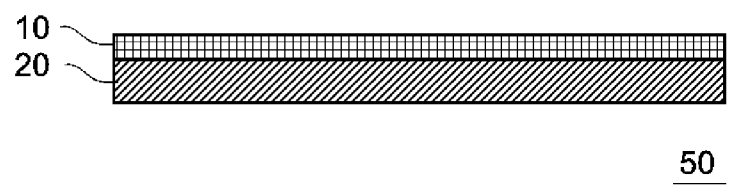
FIG. 8 is a sectional view schematically illustrating an example of the structure of an adhesive film according to the embodiment of the present invention.
Figure 9:
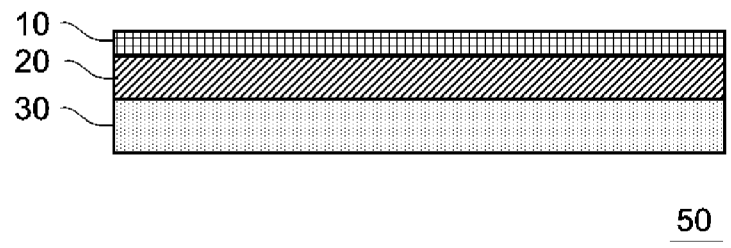
FIG. 9 is a sectional view schematically illustrating an example of the structure of the adhesive film according to the embodiment of the present invention.

FIGS. 8 and 9 are sectional views schematically illustrating an example of the structure of the adhesive film 50 according to the embodiment of the present invention.

The adhesive film 50 includes at least the adhesive resin layer 10. In addition, in the viewpoint of improving the flexibility of the adhesive film 50 and further improving the pickup performance of the electronic components 70, it is preferable that the adhesive film 50 includes the flexible resin layer 20 in addition to the adhesive resin layer 10.

In addition, in the viewpoint of achieving a favorable balance between the flexibility and the heat resistance, it is preferable that the adhesive film 50 further includes both of the flexible resin layer 20 and the heat-resistant resin layer 30 in addition to the adhesive resin layer 10.

In a case where the adhesive film 50 includes the adhesive resin layer 10, the flexible resin layer 20, and the heat-resistant resin layer 30, it is preferable that the adhesive film 50 includes the heat-resistant resin layer 30, the flexible resin layer 20, and the adhesive resin layer 10 in this order.

In this case, deformation or melting of the adhesive resin layer 10 is suppressed by the heat-resistant resin layer 30 such that positional deviation of the electronic components 70 can be suppressed. As a result, it is possible to more accurately pick up the electronic components 70 during the step (D). That is, it is possible to achieve a more favorable balance between the adhesiveness, the heat resistance, and the flexibility of the adhesive film 50.

Here, in the present embodiment, the term "heat resistance" means a dimensional stability of a film or a resin layer at a high temperature or a low temperature. That is, the more excellent in heat resistance a film or a resin layer is, the less likely deformation such as expansion, contraction, softening, or the like, melting, or the like of the film or the resin layer is to occur at a high temperature or a low temperature.

(Adhesive Resin Layer)

The adhesive resin layer 10 is a layer which comes into contact with and adheres to surfaces of the electronic components 70 when the adhesive film 50 is affixed to the electronic components 70.

Examples of an adhesive constituting the adhesive resin layer 10 include a (meth)acrylic adhesive, a silicone adhesive, a urethane adhesive, an olefin adhesive, and a styrene adhesive. Among these, a (meth)acrylic adhesive in which a (meth)acrylic polymer is a base polymer is preferable in the viewpoint of facilitating adhesive force adjustment and the like.

As an adhesive constituting the adhesive resin layer 10, a radiation-crosslinking type adhesive of which the adhesive force is decreased by radiation can be used. The adhesive resin layer 10 formed of the radiation-crosslinking type adhesive is crosslinked and the adhesive force thereof is significantly decreased when the adhesive resin layer 10 is irradiated with radiation. Therefore, the electronic component 70 can be easily picked up from the adhesive resin layer 10 in the step of picking up the electronic component 70. Examples of the radiation include ultraviolet radiation, electron beams, and infrared rays, and the like.

As the radiation-crosslinking type adhesive, an ultraviolet-crosslinking type adhesive is preferable.

Examples of a (meth)acrylic polymer contained in the (meth)acrylic adhesive include a homopolymer of a (meth)acrylic acid ester compound, a copolymer of a (meth)acrylic acid ester compound and a comonomer, and the like. Examples of the (meth)acrylic acid ester compound include methyl (meth)acrylate, ethyl (meth)acrylate, butyl (meth)acrylate, 2-ethylhexyl (meth)acrylate, hydroxyethyl (meth)acrylate, hydroxypropyl (meth)acrylate, dimethylaminoethyl (meth)acrylate, and glycidyl (meth)acrylate. These (meth)acrylic acid ester compounds may be used alone or in a combination of two or more thereof.

Examples of the comonomer constituting a (meth)acrylic copolymer include vinyl acetate, (meth)acrylonitrile, (meth)acrylamide, styrene, (meth)acrylic acid, itaconic acid, (meth)acrylamide, methylol (meth)acrylamide, and maleic anhydride. These comonomers may be used alone or in a combination of two or more thereof.

The radiation-crosslinking type adhesive includes, for example, an adhesive such as a (meth)acrylic adhesive, a crosslinking compound (component having carbon-carbon double bond), a photopolymerization initiator, or a thermal polymerization initiator.

Examples of the crosslinking compound include monomers, oligomers, and polymers having a carbon-carbon double bond in a molecule and being crosslinkable by means of radical polymerization. Examples of such a crosslinking compound include an ester of (meth)acrylic acid and polyhydric alcohol such as trimethylolpropane tri(meth)acrylate, pentaerythritol tri(meth)acrylate, tetraethylene glycol di(meth)acrylate, 1,6-hexanediol di(meth)acrylate, neopentyl glycol di(meth)acrylate, and dipentaerythritol hexa(meth)acrylate; ester (meth)acrylate oligomer; and isocyanurate or isocyanurate compounds such as 2-propenyl-di-3-butenyl cyanurate, 2-hydroxyethyl bis(2-(meth)acryloxyethyl)isocyanurate, tris(2-methacryloxyethyl)isocyanurate.

In a case where the adhesive is a radiation-crosslinking type polymer having a carbon-carbon double bond in the side chain of the polymer, a crosslinking compound may not be added.

The content of the crosslinking compound is preferably from 5 to 900 parts by mass and more preferably from 20 to 200 parts by mass with respect to 100 parts by mass of the adhesive. In a case where the content of the crosslinking compound is within the above range, the adhesive force is adjusted more easily in comparison with a case where the content is lower than the above range, and a decrease in storage stability due to an excessively high sensitivity to heat or light is less likely to occur in comparison with a case of the content exceeds the above range.

As the photopolymerization initiator, any compound which cleaves and generates radicals when being irradiated with radiation may be used. Examples of the photopolymerization initiator include benzoin alkyl ethers such as benzoin methyl ether, benzoin isopropyl ether, and benzoin isobutyl ether; aromatic ketones such as benzyl, benzoin, benzophenone, α-hydroxycyclohexyl phenyl ketone; aromatic ketals such as benzyl dimethyl ketal; polyvinyl benzophenone; and thioxanthones such as chlorothioxanthone, dodecyl thioxanthone, dimethyl thioxanthone, and diethyl thioxanthone.

Examples of the thermal polymerization initiator include an organic peroxide derivative, and an azo polymerization initiator. The organic peroxide derivative is preferable since nitrogen is not generated at the time of heating. Examples of the thermal polymerization initiator include ketone peroxide, peroxyketal, hydroperoxide, dialkyl peroxide, diacyl peroxide, peroxyester, and peroxydicarbonate.

A crosslinking agent may be added to the adhesive. Examples of the crosslinking agent include epoxy compounds such as sorbitol polyglycidyl ether, polyglycerol polyglycidyl ether, pentaerythritol polyglycidyl ether, and diglycerol polyglycidyl ether; aziridine compounds such as tetramethylolmethane tri-β-aziridinyl propionate, trimethylolpropane tri-β-aziridinyl propionate, N,N'-diphenylmethane-4,4'-bis(1-aziridinecarboxamide), and N,N'-hexamethylene-1,6-bis(1-aziridinecarboxamide); and isocyanate compounds such as tetramethylene diisocyanate, hexamethylene diisocyanate, and polyisocyanate.

The thickness of the adhesive resin layer 10 is not particularly limited. The thickness of the adhesive resin layer 10 is preferably equal to or greater than 1 µm and equal to or smaller than 100 µm and more preferably equal to or greater than 3 µm and equal to or smaller than 50 µm, for example.

The adhesive resin layer 10 can be formed, for example, by applying an adhesive coating solution on a base material layer or the flexible resin layer 20.

As a method for applying the adhesive coating solution, a known coating method in the related art such as a roll coater method, a reverse roll coater method, a gravure roll method, a bar coat method, a comma coater method, and a die coater method can be adopted. A condition under which the applied adhesive is dried is not particularly limited. However, it is generally preferable to dry the adhesive for 10 seconds to 10 minutes in a temperature range of 80° C. to 200° C. It is more preferable to dry the adhesive for 15 seconds to 5 minutes at 80° C. to 170° C. In order to sufficiently accelerate a crosslinking reaction between the crosslinking agent and the adhesive, heating may be performed for about 5 to 300 hours at 40° C. to 80° C. after the drying of the adhesive coating solution is finished.

(Flexible Resin Layer)

The flexible resin layer 20 is a layer provided for the purpose of making the properties such as the flexibility and the stretchability of the adhesive film 50 favorable.

Since the flexible resin layer 20 is provided, the stretchability and the flexibility of the adhesive film 50 are improved and the adhesive film 50 can be more easily expanded in the in-plane direction in the step (D) of picking up the electronic components 70.

The flexible resin layer 20 is not particularly limited as long as the flexible resin layer 20 can be expanded in the in-plane direction. However, it is preferable for the flexible resin layer 20 to be excellent in properties such as flexibility, stretchability, and the like, and to have a heat resistance to such an extent that the adhesiveness between the adhesive resin layer 10 and the flexible resin layer 20 can be maintained when the property evaluation of the electronic components 70 is performed at a high temperature or a low temperature.

Examples of a flexible resin constituting the flexible resin layer 20 include one or two or more selected from the group consisting of polyester elastomer, polyamide elastomer, polyimide elastomer, and polybutylene terephthalate.

The melting point of the flexible resin layer 20 is preferably equal to or higher than 100° C. and equal to or lower than 250° C.

When the flexible resin layer 20 as described above is used, thermal expansion of the adhesive film 50 at the time of the property evaluation of the electronic components 70 performed at a high temperature or a low temperature can be further suppressed.

The thickness of the flexible resin layer 20 is not particularly limited. However, the thickness of the flexible resin layer 20 is preferably, for example, equal to or greater than 10 μm and equal to or smaller than 500 μm, more preferably equal to or greater than 20 μm and equal to or smaller than 300 μm, still more preferably equal to or greater than 30 μm and equal to or smaller than 250 μm, and particularly preferably equal to or greater than 50 μm and equal to or smaller than 200 μm.

(Heat-Resistant Resin Layer)

The heat-resistant resin layer 30 is a layer provided for the purpose of making the properties such as the handleability, the mechanical properties, and the heat resistance of the adhesive film 50 more favorable.

The heat-resistant resin layer 30 is not particularly limited as long as the heat-resistant resin layer 30 has a heat resistance to such an extent that deformation or melting does not occur to such an extent that positional deviation of the electronic components 70 occurs when the property evaluation of the electronic components 70 is performed at a high temperature or a low temperature and a heat-resistant resin film can be used, for example.

Examples of a resin constituting the heat-resistant resin film include one or two or more selected from the group consisting of polyesters such as polyethylene terephthalate, polybutylene terephthalate, and polyethylene naphthalate; polyamides such as nylon-6, nylon-66, and polymetaxylene adipamide; polyimide; polyetherimide; polyamide imide; polycarbonate; modified polyphenylene ether; polyacetal; polyallylate; polysulfone; polyethersulfone; polyphenylene sulfide; polyetheretherketone; fluorine resin; liquid crystal polymer; vinylidene chloride resin; polybenzimidazole; polybenzoxazole; and poly methyl pentene.

Among these, one or two or more selected from the group consisting of polyimide, polyamide, and polyester is preferable from the viewpoint of excellent balance between the heat resistance, the mechanical strength, the transparency, the price, and the like.

The melting point of the heat-resistant resin layer 30 is preferably equal to or higher than 200° C., and more preferably equal to or higher than 220° C. Alternatively, the heat-resistant resin layer 30 preferably has no melting point, more preferably has a decomposition temperature of equal to or higher than 200° C., and still more preferably has a decomposition temperature of equal to or higher than 220° C.

When such a heat-resistant resin layer 30 is used, deformation of the adhesive film 50 can further be suppressed at the time of the property evaluation of the electronic components 70 performed at a high temperature or a low temperature.

The heat-resistant resin layer 30 may be a single layer or two or more kinds of layers.

The resin film used for forming the heat-resistant resin layer 30 may be a stretched film or a film stretched in one axial direction or two axial directions. However, the film stretched in one axial direction or two axial directions is preferable in the viewpoint of improving the heat resistance and the mechanical strength of the heat-resistant resin layer 30.

The thickness of the heat-resistant resin layer 30 is preferably equal to or greater than 10 μm and equal to or smaller than 1000 μm, more preferably equal to or greater than 10 μm and equal to or smaller than 500 μm, still more preferably equal to or greater than 20 μm and equal to or smaller than 300 μm in the viewpoint of obtaining favorable film properties.

The heat-resistant resin layer 30 may be subjected to surface treatment in order to improve the adhesiveness with respect to other layers. Specifically, corona treatment, plasma treatment, undercoat treatment, primer coating treatment, and the like may be performed.

It is preferable that the heat-resistant resin layer 30 is laminated on the flexible resin layer 20 such that the heat-resistant resin layer 30 can be peeled off.

A method of laminating the heat-resistant resin layer 30 such that the heat-resistant resin layer 30 can be peeled off is not particularly limited but examples thereof include a method of laminating the heat-resistant resin layer 30 through an adhesive layer (not shown) which can be peeled off. The adhesive layer which can be peeled off refers to a layer that can be easily peeled when any stimulus such as radiation or heat is applied thereto during the peeling off of the layer.

Examples of such an adhesive layer which can be peeled off include (1) an adhesive layer formed of a radiation-crosslinking type adhesive of which the adhesive force can be decreased by means of irradiation with radiation, (2) an adhesive layer formed of a heat-expansion type adhesive which expands when being heated and of which the adhesive force can be decreased by heating the adhesive layer, and (3) an adhesive layer which is formed of a double-sided adhesive film obtained by using a shrinkable film as a base material, which shrinks when being heated, and of which the adhesive force can be suppressed by heating the adhesive layer.

The radiation-crosslinking type adhesive has a sufficient adhesive force with respect to the heat-resistant resin layer 30 and the flexible resin layer 20 before the irradiation with radiation and of which the adhesive force is significantly decreased after the irradiation with radiation. That is, the heat-resistant resin layer 30 and the flexible resin layer 20 can be adhered to each other before the irradiation with radiation, and the heat-resistant resin layer 30 can be easily peeled from the flexible resin layer 20 after the irradiation with radiation.

As the radiation-crosslinking type adhesive, generally, a radiation-crosslinking type adhesive such as a known ultraviolet-crosslinking type adhesive or the like can be used.

The term "heat-expansion type adhesive" refers to an adhesive in which thermally expandable fine particles, a foaming agent, or the like is dispersed. As the adhesive, a generally known adhesive can be used and examples thereof include a (meth)acrylic adhesive, a silicone adhesive, a rubber adhesive, a polyurethane adhesive, and a polyvinyl ether adhesive.

Examples of the thermally expandable fine particles include fine particles in which a material that are easily gasified and expanded when being heated such as isobutane, propane, pentane, or the like is enclosed in an elastic shell.

Examples of the blowing agent include chemical substances having an ability to generate water, carbon dioxide gas, nitrogen by means of thermal decomposition, and the like.

When the thermally expandable fine particles or the blowing agent is expanded by being heated, the surface state of the adhesive layer changes, and thus the adhesive force between the flexible resin layer 20 and the heat-resistant resin layer 30 can be decreased. As a result, the heat-resistant resin layer 30 can be easily peeled from the flexible resin layer 20.

Examples of a shrinkable film used for the double-sided adhesive film obtained by using a shrinkable film as a base material include a heat shrinkable film which shrinks when being heated. For example, examples thereof include a uniaxially or biaxially stretched film formed of, for example, polyethylene terephthalate, polyethylene, polystyrene, polypropylene, polyamide, polyurethane, polyvinyl chloride, polyvinylidene chloride or the like.

As the adhesive provided on both sides of the shrinkable film, generally known adhesives can be used and examples thereof include a (meth)acrylic adhesive, a silicone adhesive, a rubber adhesive, a polyurethane adhesive, and a polyvinyl ether adhesive.

When the shrinkable film as the base material shrinks by being heated, the surface state of the adhesive layer changes, and thus the adhesive force between the flexible resin layer 20 and the heat-resistant resin layer 30 can be decreased. As a result, the heat-resistant resin layer 30 can be easily peeled from the flexible resin layer 20.

In the case of the adhesive film 50 according to the present embodiment, a mold release film may be further laminated on the adhesive resin layer 10.

Examples of the release film include a polyester film and the like subjected to mold release treatment.

The total light transmittance of the adhesive film 50 according to the present embodiment is preferably equal to or greater than 80%, more preferably equal to or greater than 85%. In this case, transparency can be imparted to the adhesive film 50. When the total light transmittance of the adhesive film 50 is set to be equal to or greater than the above-mentioned lower limit value, the adhesive resin layer 10 can be more effectively irradiated with radiation and thus the efficiency of the irradiation with radiation can be improved. Note that, the total light transmittance of the adhesive film 50 can be measured according to JIS K 7105 (1981).

Next, an example of a method for manufacturing the adhesive film 50 according to the present embodiment will be described.

The adhesive film 50 according to the present embodiment can be obtained by forming the adhesive resin layer 10 by applying an adhesive coating solution onto the base material layer or the flexible resin layer 20 and drying the adhesive coating solution.

The flexible resin layer 20 can be formed on one surface of the base material layer or the heat-resistant resin layer 30 by using an extrusion laminating method. In addition, the heat-resistant resin layer 30 and the flexible resin layer 20 may be formed by coextrusion molding, or the film-shaped heat-resistant resin layer 30 and the film-shaped flexible resin layer 20 may be formed by laminating one another.

Although the embodiments of the present invention have been described above, these are examples of the present invention and various configurations other than those described above can also be adopted.

The present invention is not limited to the above-described embodiments and variations, improvements, and the like within the scope of achieving the object of the present invention are included in the present invention.

This application claims priority based on Japanese Patent Application No. 2016-210626 filed on Oct. 27, 2016, the disclosure of which is incorporated herein in its entirety.

The invention claimed is:

1. An electronic component testing apparatus which is used to evaluate properties of an electronic component, the electronic component testing apparatus comprising:
   a sample stand including an electronic component installation region; and
   a probe card that is provided at a position facing the sample stand and includes a probe terminal,
   wherein the sample stand is provided with a first vacuum suction unit in a region on an outer peripheral side which is different from the electronic component installation region, the first vacuum suction unit in order to reduce wrinkles occurring in a temperature environment of equal to or lower than 0° C. or equal to or higher than 50° C. and equal to or lower than 200° C. vacuum-sucking a region of an adhesive film to which no electronic component is affixed, and
   wherein the sample stand is provided with a second vacuum suction unit in at least the electronic component installation region, the second vacuum suction unit holding the electronic component and the adhesive film in order to reduce wrinkles occurring in a temperature environment of equal to or lower than 0° C. or equal to or higher than 50° C. and equal to or lower than 200° C. by means of vacuum suction.

2. The electronic component testing apparatus according to claim 1,
   wherein the first vacuum suction unit is a vacuum adsorption groove which is continuously closed over an outer periphery of the sample stand.

3. The electronic component testing apparatus according to claim 1,
   wherein an outer peripheral portion of the sample stand is provided with a vacuum seal portion.

* * * * *